United States Patent [19]

Takahashi et al.

[11] Patent Number: 5,126,813
[45] Date of Patent: Jun. 30, 1992

[54] SEMICONDUCTOR PRESSURE SENSOR DEVICE WITH TWO SEMICONDUCTOR PRESSURE SENSOR CHIPS AND A METHOD OF MANUFACTURING THEREOF

[75] Inventors: Yoshiharu Takahashi; Seiji Takemura; Keitaro Tsukui; Junko Itoh; Eitaro Nagai; Yasuo Tada; Yuuji Kishimoto; Sakae Kiguchi, all of Hyogo, Japan

[73] Assignee: Mitsubishi Denki Kabushiki Kaisha, Tokyo, Japan

[21] Appl. No.: 664,569

[22] Filed: Mar. 6, 1991

[30] Foreign Application Priority Data

Mar. 7, 1990 [JP] Japan .................. 2-56215
Sep. 12, 1990 [JP] Japan ................. 2-243009

[51] Int. Cl.⁵ .................. H01L 29/84; H01L 23/48; H01L 29/06
[52] U.S. Cl. ......................... 357/26; 357/70; 357/55
[58] Field of Search ................ 357/26, 70, 55

[56] References Cited

FOREIGN PATENT DOCUMENTS 0033749 8/1981 European Pat. Off. .
0386959 2/1990 European Pat. Off. .

OTHER PUBLICATIONS

Electronics publication by Zias et al., entitled "Integration Brings a Generation of Low-Cost Transducers", 1972.

*Primary Examiner*—Mark Prenty
*Attorney, Agent, or Firm*—Lowe, Price, LeBlanc & Becker

[57] ABSTRACT

A semiconductor pressure sensor device that can improve the measuring accuracy without providing a silicon base in attaching a semiconductor pressure sensor chip to a lead frame, and a method of manufacturing thereof is disclosed. The semiconductor pressure sensor device includes a die-bond adhesive 10 formed of a resilient material for fixing a semiconductor pressure sensor chip 50 to a lead frame 100, a wire bond receiving projection 4 provided in the diepad where the semiconductor pressure sensor chip 50 is attached for receiving pressure application force from the bottom of the semiconductor pressure sensor chip 50 at the time of wire bonding, and a supporting projection 11 for preventing distortion stress by the wire bond receiving projection 4 from being transmitted. Thermal distortion of the semiconductor pressure sensor chip 50 and the lead frame 100 is absorbed by die-bond adhesive 10. By wire bond receiving projection 4 and supporting projection 11, stress acting on the semiconductor pressure sensor chip 50 is decreased to improve the measuring accuracy.

10 Claims, 13 Drawing Sheets

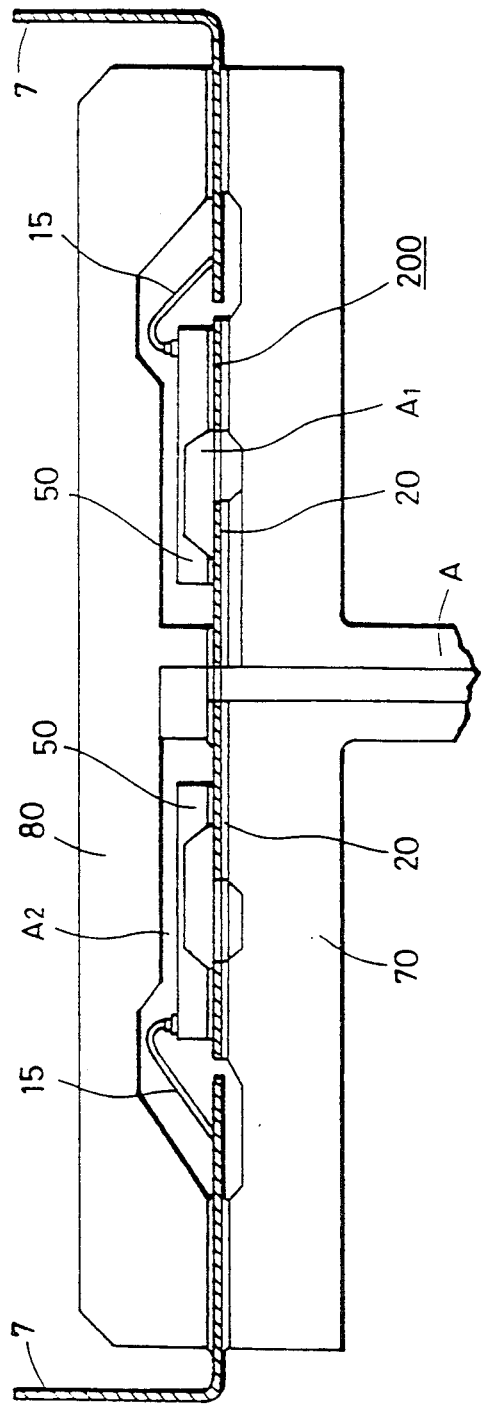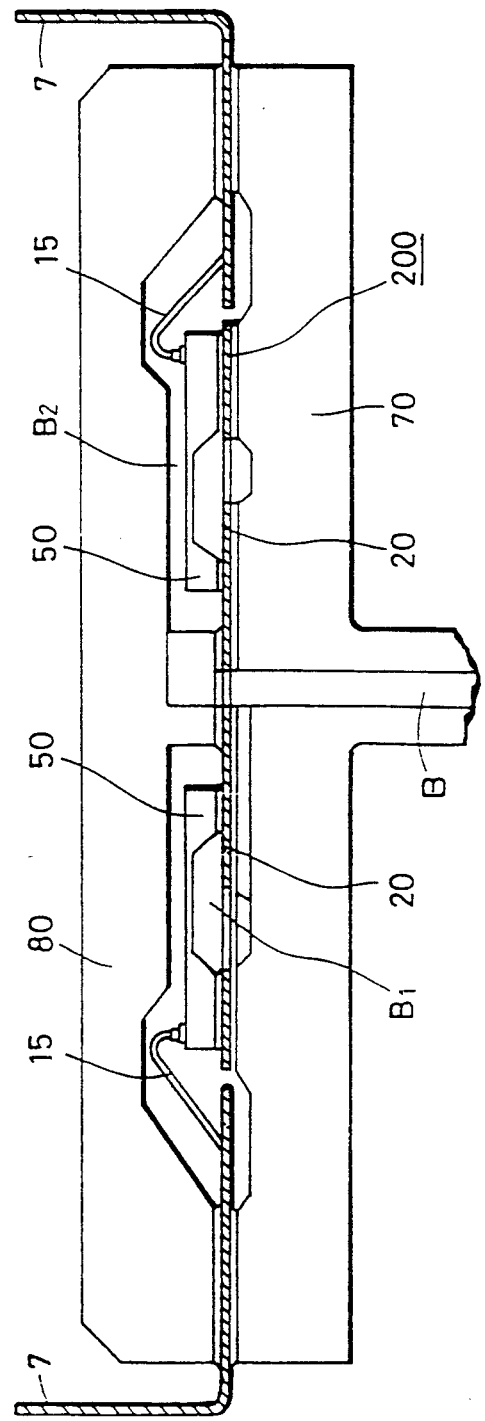

SEMICONDUCTOR PRESSURE SENSOR DEVICE WITH TWO SEMICONDUCTOR PRESSURE SENSOR CHIPS AND A METHOD OF MANUFACTURING THEREOF

BACKGROUND OF THE INVENTION

1. Field of the Invention

The present invention relates to semiconductor pressure sensor devices and a method of forming the same, and more particularly, to a semiconductor pressure sensor device constituted by semiconductor pressure sensor chips having a pressure sensor for sensing pressure, an amplifying circuit for amplifying the signal from the pressure sensor, and electrodes integrated on a semiconductor substrate, and a lead frame where the semiconductor pressure sensor chip is mounted, and a method of manufacturing thereof.

2. Description of the Background Art

The method of directly die-bonding the semiconductor pressure sensor chip to the lead frame is generally known in conventional semiconductor pressure sensor devices.

FIG. 12 is a plan view of a conventional semiconductor pressure sensor chip; FIG. 13 is a side view of the semiconductor pressure sensor chip of FIG. 12; and FIG. 14 is a sectional view taken along plane B/B of FIG. 12. Referring to FIGS. 12–14, a semiconductor pressure sensor chip comprises a pressure sensor 51 with an embedded gauge resistor for sensing pressure, an integrated circuit 52 having an amplifying circuit and the like for amplifying the signal from pressure sensor 51, electrodes 53 for external leading, and a diaphragm constitution 54 for forming a diaphragm of pressure sensor 51.

FIG. 15 is a plan view of a lead frame 200 where the semiconductor pressure sensor chip is mounted. FIG. 16 is a side view of lead frame 200 of FIG. 15. Referring to FIGS. 15 and 16, lead frame 200 comprises a diepad 20 which is the chip mounting section where the semiconductor pressure sensor chip is mounted, a pressure receiving opening 3 formed in diepad 20, inner leads 5, a diver 6 for preventing resin from flowing over, and outer leads 7.

FIG. 17 is a plan view of a completed semiconductor pressure sensor device where the conventional semiconductor pressure sensor chip 50 is mounted on lead frame 200. FIG. 18 is a side view of the semiconductor pressure sensor device of FIG. 17. Referring to FIGS. 17 and 18, semiconductor pressure sensor chip 50 is directly die-bonded to diepad 20 of lead frame 200. Electrode 53 of semiconductor pressure sensor chip 50 and inner lead 5 are wire bonded by a metal fine wire 15. FIG. 19 is an enlarged partial view of C—C of diepad 20 in the semiconductor pressure sensor device of FIG. 17. Referring to FIG. 19, diepad 20 and semiconductor pressure sensor chip 50 are fixed together by an adhesive 30.

It is mentioned above that semiconductor pressure sensor chip 50 is directly die-bonded to lead frame 200 by adhesive 30 in a conventional semiconductor pressure sensor device. The expansion coefficients of lead frame 200 and semiconductor pressure sensor chip 50 are different to that of adhesive 30 in a conventional semiconductor pressure sensor device. This causes the generation of a thermal distortion, leading to the inconvenience that tension and bending moment are exerted upon pressure sensor 51 of semiconductor pressure sensor chip 50.

FIG. 20 is a diagram for explaining the tension and bending moment generated in semiconductor pressure sensor chip 50 and adhesive 30. Referring to FIG. 20, tension $F_{51}$ and bending moment $M_{51}$ are generated by thermal distortion in pressure sensor 51 of semiconductor pressure sensor chip 50. Tension $F_{30}$ and bending moment $M_{30}$ are generated in adhesive 30. Tension $F_{20}$ and bending moment $M_{20}$ are generated in diepad 20. This gives the balanced state expressed by the following equations of (1) and (2) in the case of thermal distortion.

$$F_{51} + F_{20} + F_{30} = 0 \tag{1}$$

$$M_{51} + M_{20} + M_{30} = 0 \tag{2}$$

Therefore, tension $F_{51}$ and bending moment $M_{51}$ acting on pressure sensor 51 of semiconductor pressure sensor chip 50 are expressed as in the following equations (3) and (4).

$$F_{51} = -(F_{20} + F_{30}) \tag{3}$$

$$M_{51} = -(M_{20} + M_{30}) \tag{4}$$

There was also a disadvantage that the distribution of thermal stress caused by the difference in expansion coefficients is not in uniform because the symmetry of integrated circuit 52 and electrodes 53 with the other portions is not appropriate, when pressure sensor 51 is considered as the center in FIG. 19. This led to an inconvenience that measurement of high accuracy could not be achieved.

Therefore, a method of mounting the semiconductor pressure sensor chip on a lead frame with a silicon base formed of silicon monocrystal therebetween was considered to absorb and decrease the thermal stress exerted upon pressure sensor 51. This approach was taken due to the fact that the material and hence the expansion coefficient of the silicon base is equal to that of semiconductor pressure sensor chip 50, resulting in substantial suppression of thermal stress generation.

Regarding the method of mounting semiconductor pressure sensor chip 50 onto lead frame 200 with a silicon base formed of silicon monocrystal therebetween, firstly the semiconductor pressure sensor chip is die-bonded on the silicon base. Then this silicon base is die-bonded to lead frame 200, followed by wire bonding electrode 53 of semiconductor pressure sensor chip 50 to inner lead 5 of lead frame 200 by metal fine wire 15. However, this method of mounting the semiconductor pressure sensor chip 50 to lead frame 200 requires the implementation of a silicon base for absorbing and relaxing thermal stress. Die-bonding therefore must be carried out two times, complicating the manufacturing steps to increase the cost.

It is necessary to form a pressure measuring chamber (cavity) for measuring air pressure in the lead frame with the semiconductor pressure sensor chip 50 shown in FIGS. 17 and 18 mounted, when used as a fine differential pressure sensor for measuring air pressure. FIGS. 21A and 21B show sectional structures of a semiconductor pressure sensor device having a cavity for measuring air pressure. FIG. 21C is a plan view of the semiconductor pressure sensor device of FIGS. 21A and 21B without a cap. Referring to FIGS. 21A–21C, a semiconductor pressure sensor device in the case of measuring air pressure comprises a semiconductor pressure sensor chip 50 for measuring air pressure, a lead frame 200 having semiconductor pressure sensor chip 50 mounted, a base 70 having lead frame 200 mounted above, and a cap 80 attached to lead frame 200 over lead frame 200 and semiconductor pressure sensor chip 50. Two cavities for measuring air pressure are formed by base 70, cap 80, and diepad 20 provided in lead frame 200. Specifically, pressure inlets A and B are provided individually as shown in FIG. 21C. Pressure entering through pressure inlet A is introduced into cavities $A_1$ and $A_2$, as shown in FIG. 21A. Pressure entering pressure inlet B is introduced to cavities $B_1$ and $B_2$, as shown in FIG. 21B. By measuring pressure individually by two pressure sensor chips 50, the measuring accuracy is improved in comparison with measurement by only one pressure sensor chip 50. In a semiconductor pressure sensor device having such a structure, a method is employed of attaching base 70 and cap 80 to lead frame 200 where semiconductor pressure sensor chip 50 is mounted. However there was an inconvenience that the adhesive resin for attaching base 70 and cap 80 to lead frame 200 flows to the semiconductor pressure sensor chip 50 side to adhere to semiconductor pressure sensor chip 50. This aggravates the characteristics of semiconductor pressure sensor chip 50.

Diepad 20 of a conventional lead frame 200 is supported asymmetrical by the outer frame of lead frame 200 and one of the inner leads 5, as shown in FIG. 17. When lead frame 200 is attached to base 70, as shown in FIG. 21A, using an adhesive resin of high viscosity as the adhesive, there was the inconvenience that the portion not supported by the diepad was raised by the adhesive resin applied on the surface of base 70. This led to a problem that it was difficult to fix diepad 20 on base 70 horizontally. A fixing jig had to be used in attaching diepad 20 to base 70 for solving the above mentioned problems, resulting in the complication of the manufacturing process.

Because the two diepads 20 have an isolated structure, as shown in FIG. 17, there was also the problem that physical continuity could not be maintained regarding the deformation which the two semiconductor pressure sensor chips 50 receive if external force is exerted on lead frame 200. In the case where the semiconductor pressure sensor device of FIGS. 21A-21C is used as the fine differential pressure sensor, it was necessary to provide the two semiconductor pressure sensor chips 50 within the two sealed cavities, respectively, where the divided portion between the two diepads of FIG. 17 had to be sealed with an adhesive resin at a later step. However, the sealing performance could not be improved because there was difference in the thickness of the adhesive resin at the divided portion and the diepad 20 portion.

SUMMARY OF THE INVENTION

An object of the present invention is to improve the measuring accuracy in a semiconductor pressure sensor device without implementing a silicon base in mounting a semiconductor pressure sensor chip to the lead frame.

Another object of the present invention is to efficiently prevent the adhesive resin from being adhered to the semiconductor pressure sensor chip to aggravate the pressure measuring characteristic in a semiconductor pressure sensor device, in fixing a base and a cap to the lead frame where the semiconductor pressure sensor chip is mounted.

A further object of the present invention is to fix the diepads horizontally with ease without using a fixing jig in a semiconductor pressure sensor device, in attaching the diepads of the lead frame to the base.

A still further object of the present invention is to improve sealing performance of the cap and base attached above and below the lead frame, as well as to maintain physical continuity in the two semiconductor pressure sensor chips with respect to deformation by external force, in a semiconductor pressure sensor device.

Another object of the present invention is to normally pressure-attach the electrodes and the fine wires without the pressure application force being absorbed by an intermediate fixing layer in pressure-attaching the electrode and the metal fine wire in a method of manufacturing a semiconductor pressure sensor device.

In accordance with an aspect of the present invention, a semiconductor pressure sensor device includes an intermediate fixing layer formed of a resilient material having a predetermined thickness absorbing and relaxing thermal distortion generated between the semiconductor pressure sensor chip and the lead frame for fixing the semiconductor pressure sensor chip to the lead frame, a stress-resisting projection provided at a position corresponding to the electrodes of the semiconductor pressure sensor chip on the lead frame for receiving pressure application force from the bottom of the semiconductor pressure sensor chip when the electrode and the fine wire are pressure-attached, and a supporting projection provided at a predetermined position of the lead frame for preventing the distortion stress by the stress-resisting projecting from being transmitted to the pressure sensor of the semiconductor pressure sensor chip.

In operation, an intermediate fixing layer having a predetermined thickness is provided at the mounting position of the semiconductor pressure sensor chip on the lead frame for fixing the semiconductor pressure sensor chip to the lead frame, with the semiconductor pressure sensor chip fixed on the intermediate fixing layer, where the intermediate fixing layer is formed of a resilient material that can absorb and relax the thermal distortion difference between the pressure sensor chip mounted on the lead frame and the lead frame. Thermal stress acting between the lead frame and the semiconductor pressure sensor chip is decreased. A stress-resisting projection is provided at a position corresponding to the electrode of the semiconductor pressure sensor chip of the lead frame for receiving pressure application force from the bottom of the semiconductor pressure sensor chip when the electrode and the metal fine wire are pressure-attached. A supporting projection is provided at a predetermined position for preventing distortion stress by the stress-resisting projection from being transmitted to the pressure sensor of the semiconductor pressure sensor chip. Therefore, the pressure application force used in pressure-attaching the electrode and the metal fine wire is not absorbed by the intermediate fixing layer, and distortion stress is not generated by the stress-resisting projection of the pressure sensor of the semiconductor pressure sensor chip.

In accordance with another aspect of the present invention, a semiconductor pressure sensor device comprises diepads provided in the lead frame and where the semiconductor pressure sensor chip is mounted, and an outer frame provided in the lead frame so that one portion thereof connects and supports the diepad, having a resin antiflowing groove formed along at least one portion of the interface region with the diepad.

In operation, a diepad where the semiconductor pressure sensor chip is mounted is provided in the lead frame. Also an outer frame having a resin antiflowing groove formed along at least one portion of the interface region with the diepad is provided in the lead frame so that at least one portion thereof is connected to and supports the diepad. Therefore, the adhesive resin flowing to the semiconductor pressure sensor chip side in fixing the cap and base over and beneath the lead frame runs into the resin antiflowing groove.

According to still another aspect of the present invention, a semiconductor pressure sensor device comprises diepads provided in the lead frame for mounting the semiconductor pressure sensor chip, and an outer frame provided in the lead frame for connecting and supporting diagonally the diepad at least at two locations.

In operation, the diepad where the semiconductor pressure sensor chip is mounted is provided in the lead frame. An outer frame is provided in the lead frame for connecting and supporting the diepad at least at two locations. Therefore, the diepad is supported symmetrically to prevent the diepad of the lead frame from being raised by the adhesive resin in fixing the diepad of lead frame to the base, eliminating the need of a fixing jig.

In a further aspect of the present invention, a semiconductor pressure sensor device includes diepads provided in the lead frame and having the semiconductor pressure sensor chip mounted thereon, and an outer frame provided in the lead frame so that at least one portion thereof connects and supports the diepad, and connected to each other at the center portion between adjacent diepads.

In operation, a diepad having a semiconductor pressure sensor chip mounted thereon is provided in the lead frame. An outer frame connected to each other at the center portion between adjacent diepads is provided in the lead frame so that at least one portion thereof connects and supports the diepads. Therefore, the thickness of the adhesive is uniformed at the center portion in fixing a base and a cap to the lead frame by an adhesive, and external force is transmitted to the two semiconductor pressure sensor chips physically continuously.

In a still further aspect of the present invention, a method of manufacturing a semiconductor pressure sensor device includes the steps of fixing a lead frame having a stress-resisting projection formed at a position corresponding to the electrode of the semiconductor pressure sensor chip and a supporting projection formed at a predetermined location for maintaining the semiconductor pressure sensor chip horizontally, with the semiconductor pressure sensor chip by an intermediate fixing layer having a predetermined thickness and stress relaxing ability, and pressure-attaching the metal fine wire to the electrode with the bottom thereof received by the stress-resisting projection.

In operation, a lead frame having a stress-resisting projection formed at a position corresponding to the electrode of the semiconductor pressure sensor chip and a supporting projection formed at a predetermined position for maintaining the semiconductor pressure sensor chip horizontally, and the semiconductor pressure sensor chip are fixed by an intermediate fixing layer having a predetermined thickness and stress relaxing ability. The electrode is pressure-attached to the metal fine wire with the bottom of the electrode of the semiconductor pressure sensor chip received by the stress--resisting projection. Therefore, the electrode and the metal fine wire can be connected normally without the pressure application force being absorbed by the intermediate fixing layer. Also, thermal stress acting between the lead frame and the semiconductor pressure sensor chip is relaxed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 21A and 21B are sectional views showing the structures of a semiconductor pressure sensor device having cavities for measuring air pressure.

DESCRIPTION OF THE PREFERRED EMBODIMENTS

Figure 1:
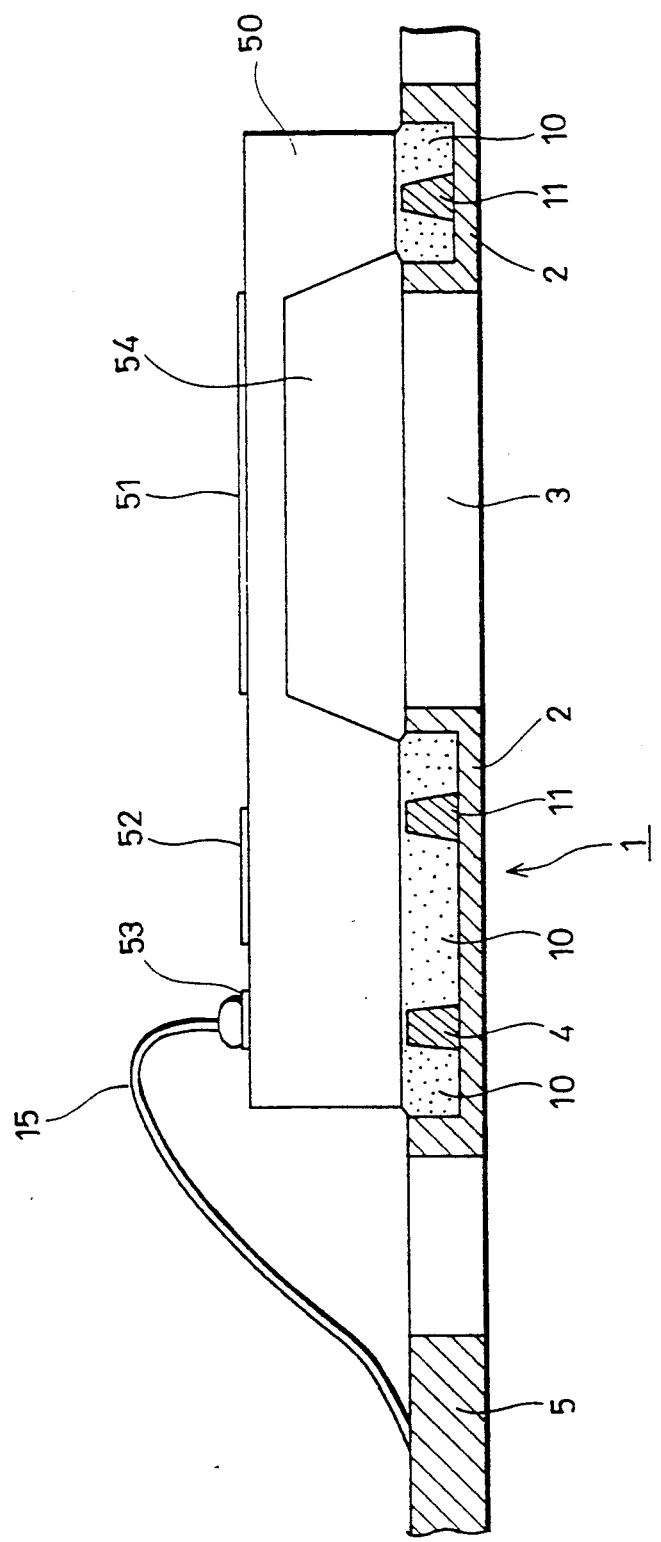
FIG. 1 is an enlarged view of a diepad of the semiconductor pressure sensor device showing an embodiment of the present invention.

Referring to FIGS. 1-5, the structure of diepad 1 of lead frame 100 will be explained hereinafter. Diepad 1 of lead frame 100 comprises a concavity 2 for forming an adhesive layer having a predetermined thickness for fixing semiconductor pressure sensor chip 50, a projection 4 for wire bonding corresponding to electrodes 53 for receiving the bottom of semiconductor pressure sensor chip 50 in pressure-attaching a metal fine wire to the electrode of semiconductor pressure sensor chip 50, a supporting projection 11 for canceling tension and bending moment generated by wire bond receiving projection 4, and a pressure receiving opening 3 provided corresponding to a diaphragm constitution 54 of semiconductor pressure sensor chip 50.

In concave 2 of diepad 1, an adhesive 10 for die-bond is formed at a predetermined thickness. A silicon type resin having stress relaxing ability is used as the material of the adhesive.

Figure 3:
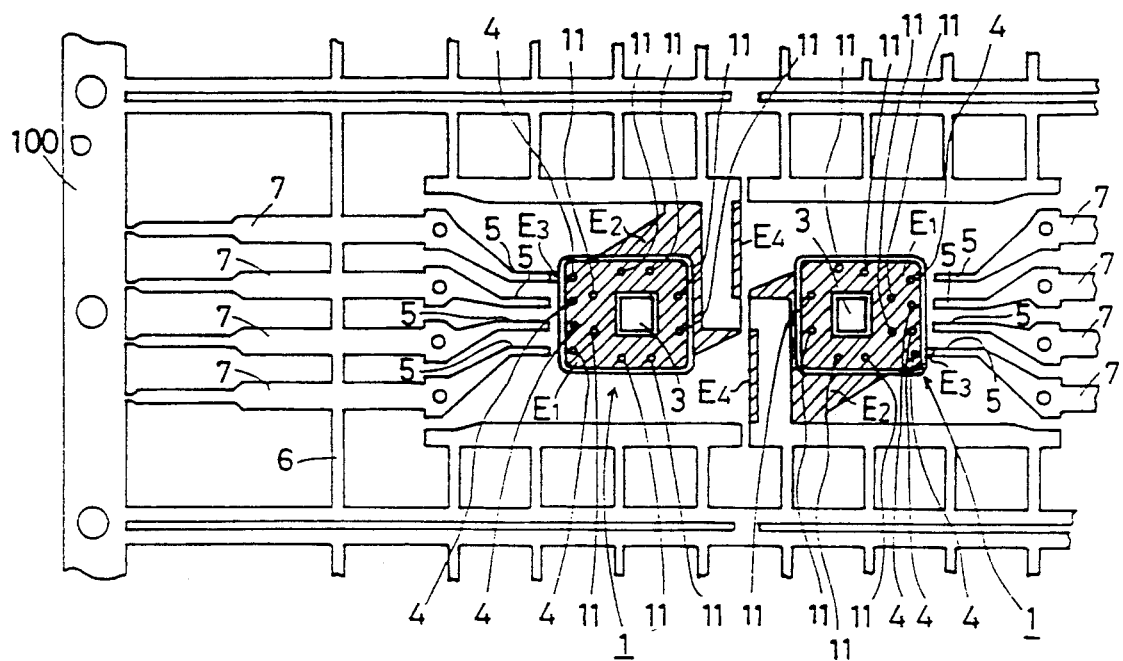
FIG. 3 is plan view showing an embodiment of the lead frame where the semiconductor pressure sensor chip 50 of FIG. 1 is mounted.
Figure 4:
FIG. 4 is a side view of the lead frame 100 of FIG. 3.
Figure 5:
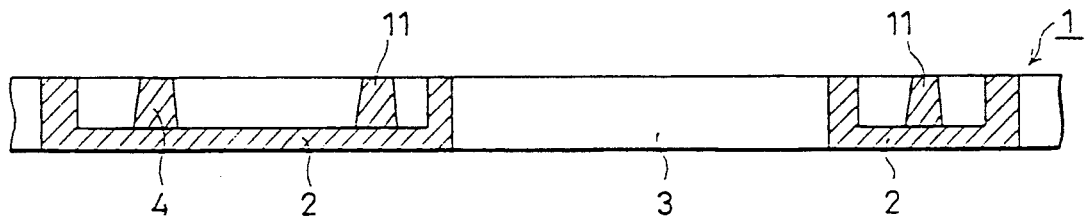
FIG. 5 is an enlarged sectional view of the diepad of the lead frame 100 of FIG. 3.

Lead frame 100 of FIG. 3 comprises a concave 2, a pressure receiving opening 3, a diepad 1 constituted by wire bond receiving projection 4 and supporting projection 11, an inner lead 5 for wire bonding the electrode of pressure sensor chip 50 and the metal fine wire in mounting semiconductor pressure sensor chip 50 to lead frame 100, a driver 6, and an outer lead 7.

Lead frame 100 is provided with etching regions $E_1$-$E_4$. Etching region $E_1$ is provided for forming adhesive 10 of FIG. 1 for die bonding, and is equivalent to concave 2. The thickness of adhesive 10 (refer to FIG. 1) can be ensured by etching region $E_1$. Etching region $E_2$ is provided for the purpose of resin antiflow to prevent excessive adhesive resin overflowing from the adhesive region of the cap from being adhered to semiconductor pressure sensor chip 50 (refer to FIG. 1) when the cap is fixed to lead frame 100. There is also the purpose of preventing external load from the cap from being transmitted via lead frame 100 and adhesive 10 (refer to FIG. 1). Etching region $E_3$ is provided for reducing the externally transmitted load via suspension lead (inner lead 5). Etching region $E_4$ is the resin antiflow groove for preventing the flowing of excessive adhesive resin in fixing the cap to lead frame 100. Although all etching regions $E_1$-$E_4$ are provided in the present embodiment, the present invention is not limited to this. The etching regions may be provided in combination if necessary.

Figure 2A:
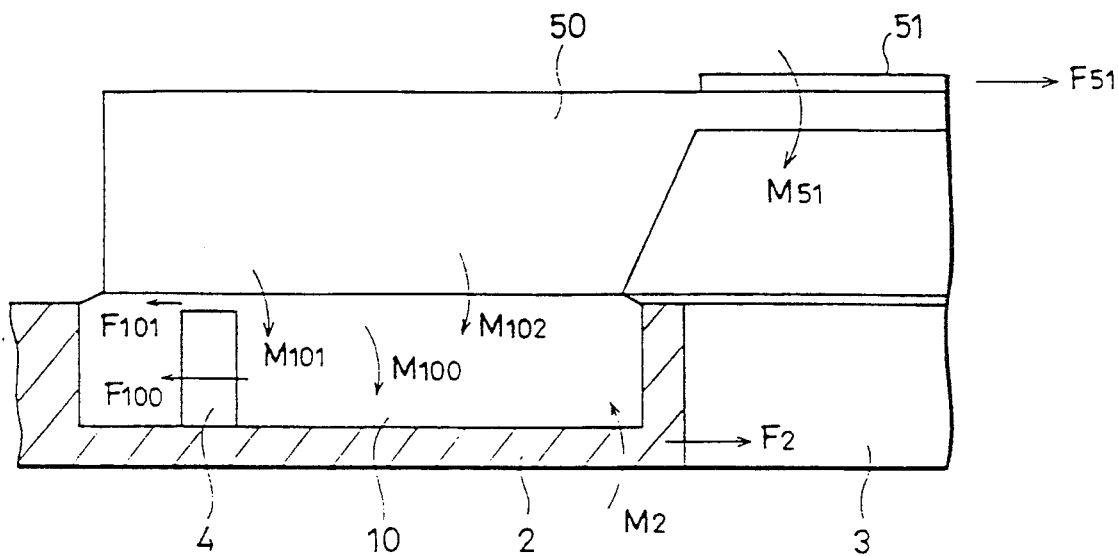
FIG. 2A is a schematic diagram for explaining the tension and the bending moment due to thermal distortion generated by providing a projection for wire bonding in the diepad of FIG. 1.
Figure 2B:
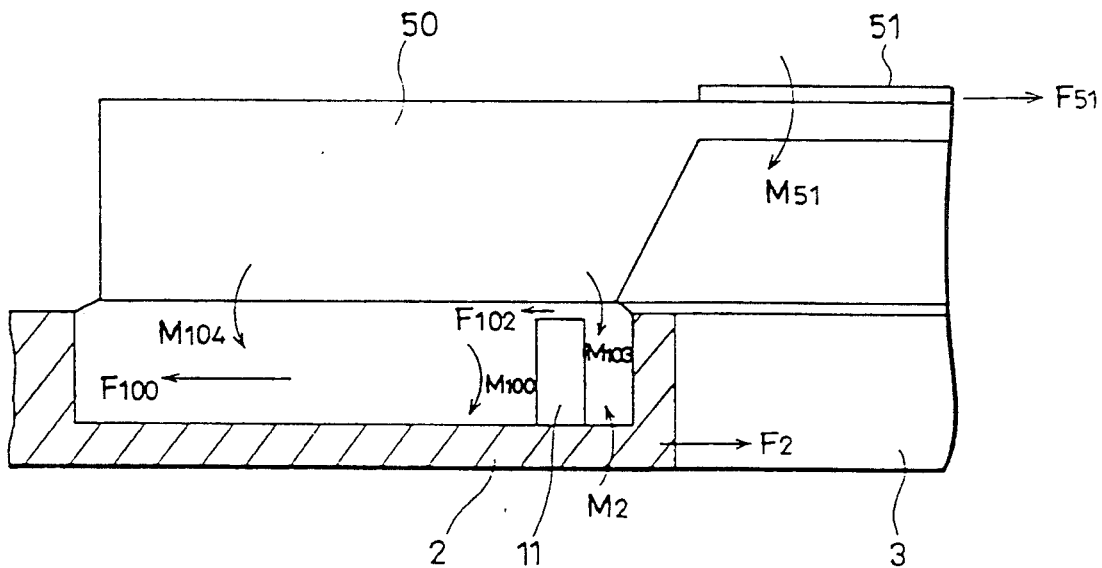
FIG. 2B is a schematic diagram for explaining the tension and the bending moment by the supporting projection provided to cancel the tension and bending moment generated by the projection for wire bonding of the diepad of FIG. 1.

Referring to FIGS. 2A and 2B, the tensions and bending moments in the case where only wire bond receiving projection 4 is provided, and in the case where supporting projection 11 is also provided for canceling the tension and the bending moment generated by wire bond receiving projection 4. Referring to FIG. 2A where only stress-resisting projection 4 is provided, tensions $F_2$, $F_{100}$, and $F_{101}$ are generated, while bending moments $M_2$, $M_{100}$, $M_{101}$ and $M_{102}$ are generated. The balancing state of the forces in the case of thermal stress generation are expressed as in the following equations (5) and (6).

$$F_{51}+F_{101}+F_{100}+F_2=0 \quad (5)$$

$$M_{51}+M_{102}+M_{101}+M_{100}+M_2=0 \quad (6)$$

Figure 15:
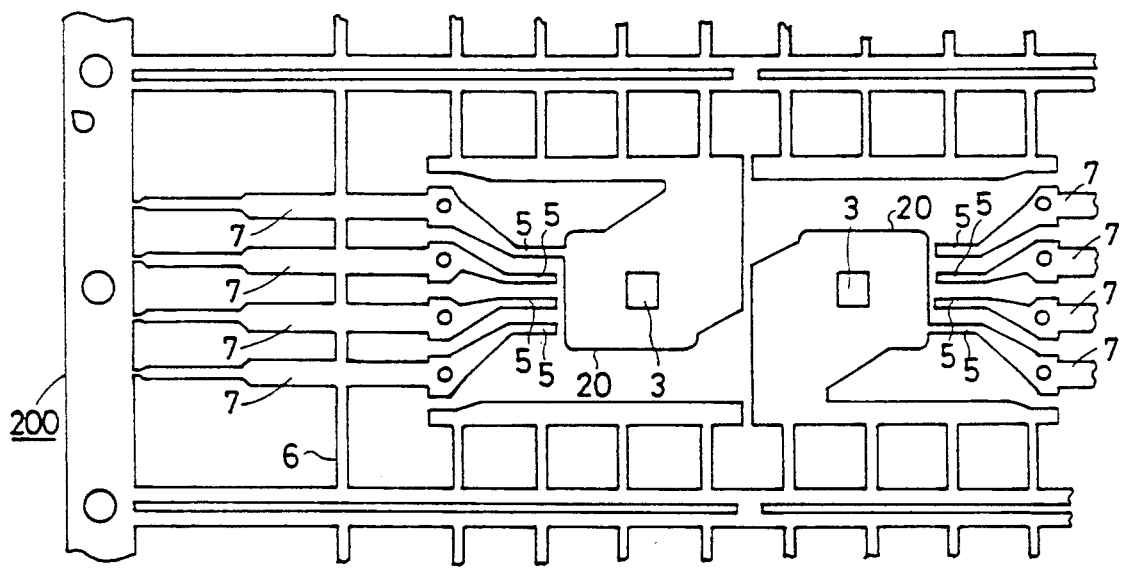
FIG. 15 is a plan view of a lead frame implementing a conventional semiconductor pressure sensor device.
Figure 16:
FIG. 16 is a side view of the lead frame of FIG. 15.
Figure 17:
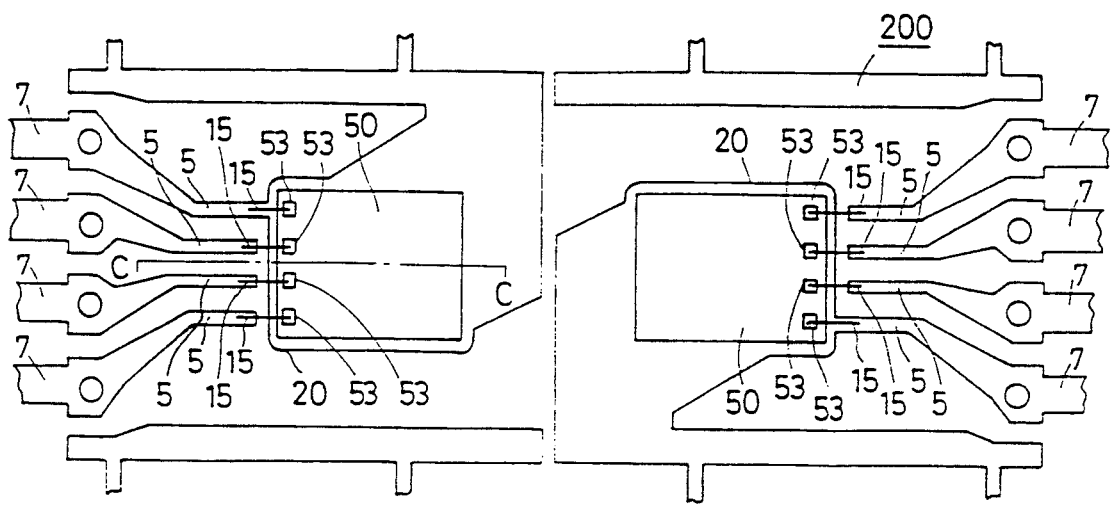
FIG. 17 is a plan view of a completed semiconductor pressure sensor device having a semiconductor pressure sensor chip mounted on the lead frame of FIG. 15.
Figure 18:
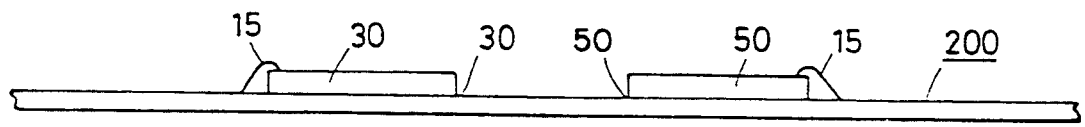
FIG. 18 is a side view of the semiconductor pressure sensor device of FIG. 17.
Figure 19:
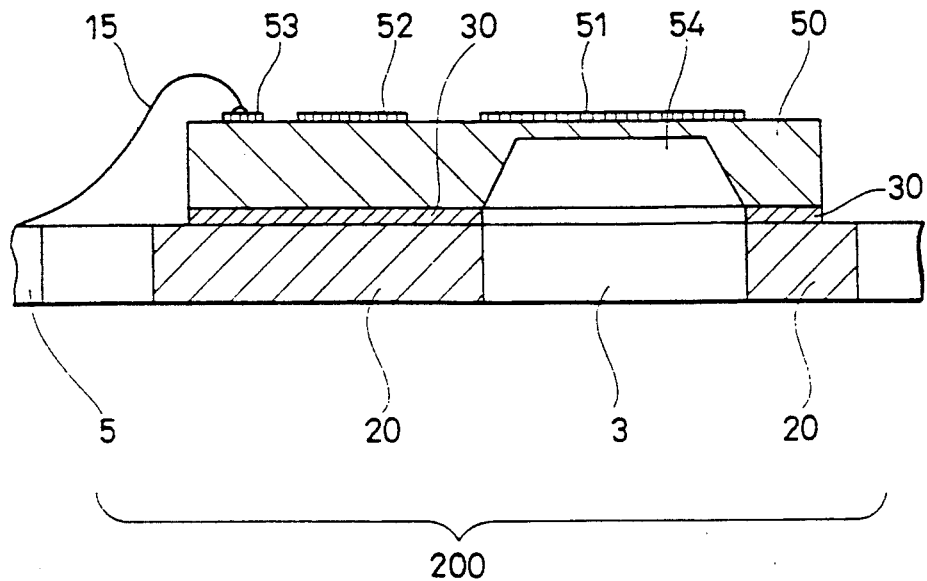
FIG. 19 is a partial enlarged view taken along C—C of the diepad of the semiconductor pressure sensor device of FIG. 17.
Figure 20:
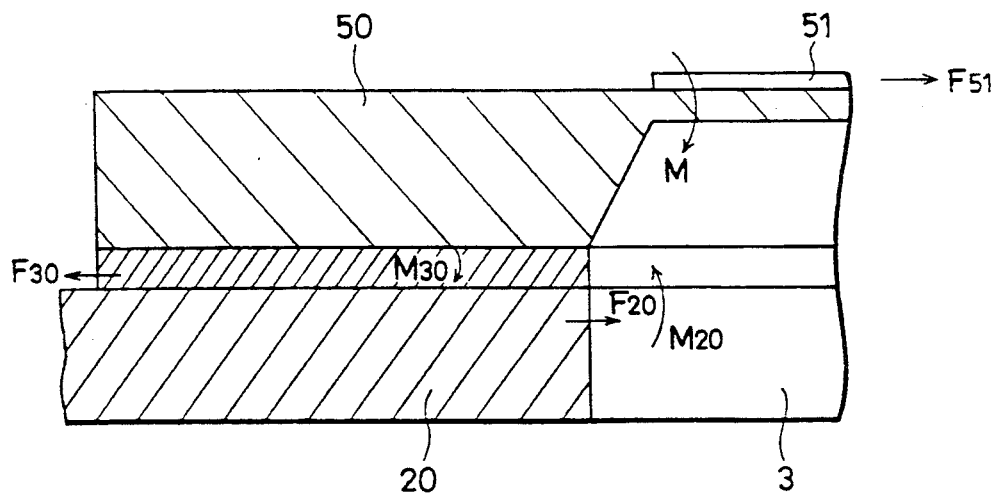
FIG. 20 is a schematic diagram for explaining the tension and bending moment generated in the conventional semiconductor pressure sensor chip of FIG. 19.
Figure 21C:
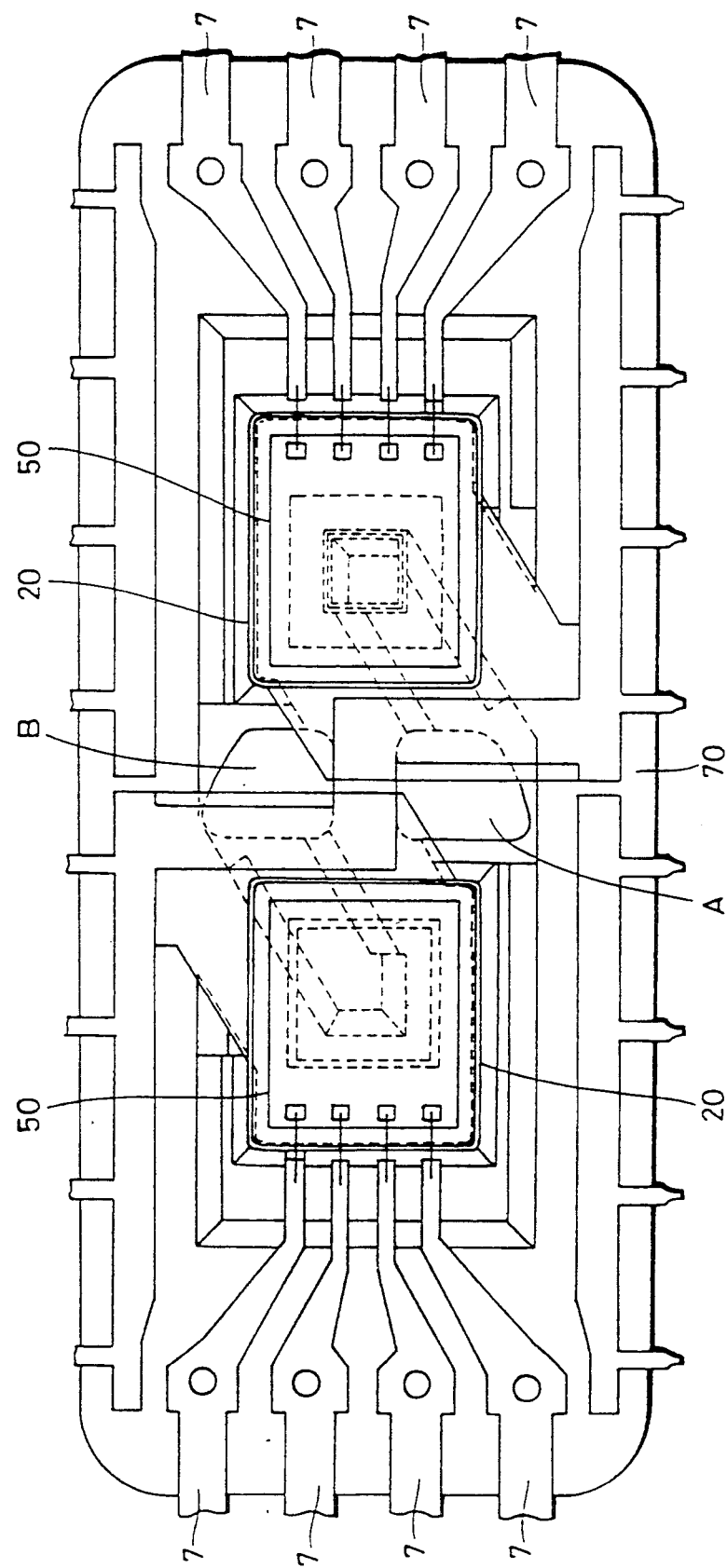
FIG. 21C is a plan view of the semiconductor pressure sensor device of FIGS. 21A and 21B without a cap.

Comparing these equations (5) and (6) with equations (1) and (2) used for explaining the stress state of the conventional semiconductor pressure sensor chip of FIG. 15, $F_{30}$ and $F_{20}$ of equation (1) correspond to $F_{100}$ and $F_2$ of equation (5), respectively, whereas $M_{30}$ and $M_{20}$ of equation (2) correspond to $M_{100}$ and $M_2$ of equation (6), respectively. The tension and bending moment generated newly by providing wire bond receiving projection 4 are $F_{101}$, $M_{101}$, and $M_{102}$. To cancel this tension $F_{101}$ and bending moments $M_{101}$ and $M_{102}$, a supporting projection 11 shown in FIG. 2B is provided in the present embodiment. By this provision of supporting projection 11, tension $F_{51}$ and bending moment $M_{51}$ generated at pressure sensor 51 of semiconductor pressure sensor chip 50 are represented by the following equations (7) and (8).

$$F_{51} = -(F_{102} + F_{101} + F_{100} + F_2) \quad (7)$$
$$M_{51} = -(M_{104} + M_{103} + M_{102} + M_{101} + M_{100} + M_2) \quad (8)$$

Supporting projection 11 is arranged so that bending moment $M_{104}$ of equation (8) becomes as expressed in the following equation (9).

$$M_{104} = -(M_{103}+M_{102}+M_{101}+M_{100}+M_2) \quad (9)$$

The above mentioned arrangement of supporting projection 11 will make $M_{51}=0$ in equation (8). That is to say, the bending moment acting upon pressure sensor 51 can be made 0. Supporting projection 11 may be arranged so that the value of bending moment $M_{51}$ of pressure sensor 51 is not 0 but an arbitrary designated value. In this case, it is possible to implement the semiconductor pressure sensor device so that the predetermined bending moment generated at pressure sensor 51 of semiconductor pressure sensor chip 50 cancels the offset value which semiconductor pressure sensor chip 50 itself possesses.

Figure 6A:
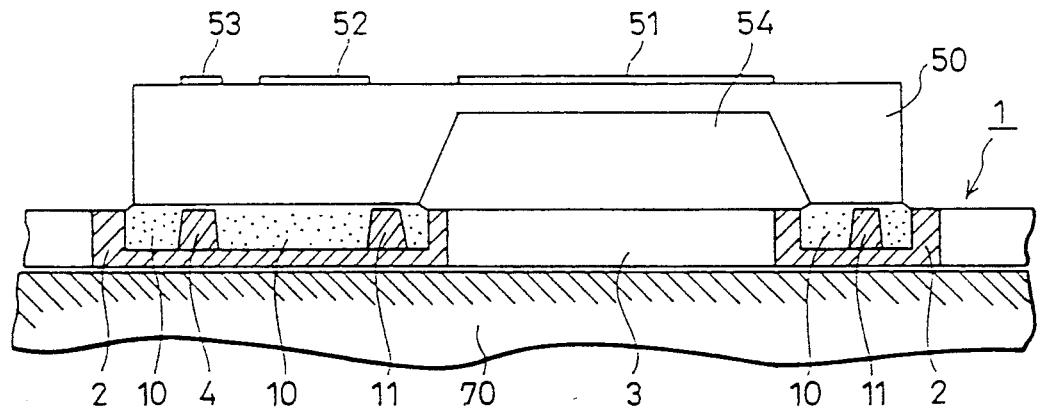
FIGS. 6A and 6B are sectional views for explaining the manufacturing steps of the semiconductor pressure sensor device of FIG. 1.
Figure 6B:
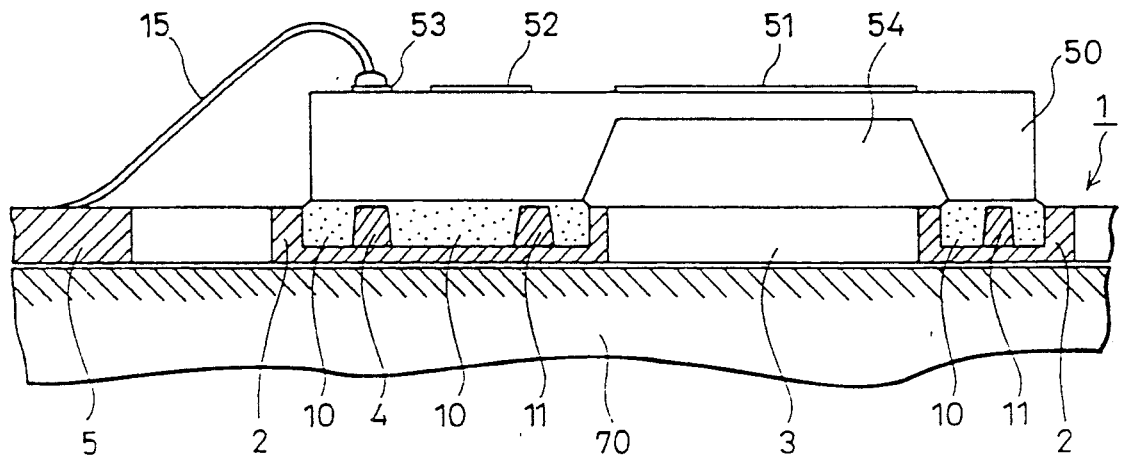

FIGS. 6A and 6B are sectional structure views for explaining the manufacturing steps of the semiconductor pressure sensor device of FIG. 1. Referring to FIGS. 1, 6A and 6B, the manufacturing steps will be explained hereinafter. Diepad 1 of lead frame 100 provided with wire bond receiving projection 4 and supporting projection 11 is mounted on a die-bond jig 700. Adhesive 10 formed of silicon type resin for die bond is implanted into concave 2 of diepad 1. Semiconductor pressure sensor chip 50 is die-bonded by being adhered on the implanted adhesive 10. Next, inner lead 5 and electrode 53 of semiconductor pressure sensor chip 50 are wire bonded by metal fine wire 15, as shown in FIG. 6B. The pressure application force received by semiconductor pressure sensor chip 50 in pressure-attaching metal fine wire 15 to electrode 53 is received by wire bond receiving projection 4 provided in concave 2. Electrode 53 can be attached properly without the pressure application force being absorbed by die-bonding adhesive 10. Thus, diepad 1 of the semiconductor pressure sensor device of FIG. 1 is formed. Between semiconductor pressure sensor chip 50 and diepad 1, die-bonding adhesive 10 having uniform thickness and stress decreasing ability is implemented. Thermal stress generated at pressure sensor 51 of semiconductor pressure sensor chip 50 is relaxed to improve the measuring accuracy of the semiconductor pressure sensor device. In accordance with the present method, it is not necessary to provide a silicon base formed of silicon monocrystal between semiconductor pressure sensor chip 50 and diepad 1. The increase in manufacturing cost and complexity of manufacturing steps in the case of providing a silicon base can be suppressed.

In accordance with the semiconductor pressure sensor device and the method of manufacturing the present embodiment, diepad 1 of lead frame 100 is provided with concave 2, wire bond receiving projection 4, and supporting projection 11, whereby die-bonding and wire bonding are carried out through a conventional manufacturing step generally used in ICs. Therefore, an adhesive layer of resilient material having stress relaxing ability and a predetermined thickness is formed, by which wire bonding can be carried out based on the thickness thereof. Although a silicon type resin is used as die-bond adhesive 10 in the present embodiment, this is by way of example only and any adhesive having stress decreasing ability may be used. Although the stress decreasing feature was implemented with an adhesive in the present embodiment, the invention is not limited to this and stress decreasing feature may be implemented with rubber and the like by applying an adhesive on both sides of a resilient material such as rubber for attaching. A resin antiflowing groove is provided by forming a concave in the diepad of the lead frame for obtaining a thick adhesive layer in the present embodiment. However, similar results can be achieved by implementing the die-bond material with a tape having a predetermined thickness instead of the adhesive. The provision of a concavity in the diepad allows the formation of a thick adhesive layer in the present invention. This gives the advantage of improving the ability to absorb the transmission of external load, and to absorb thermal stresses of diepads and the semiconductor pressure sensor chip, in comparison with conventional techniques.

Figure 7:
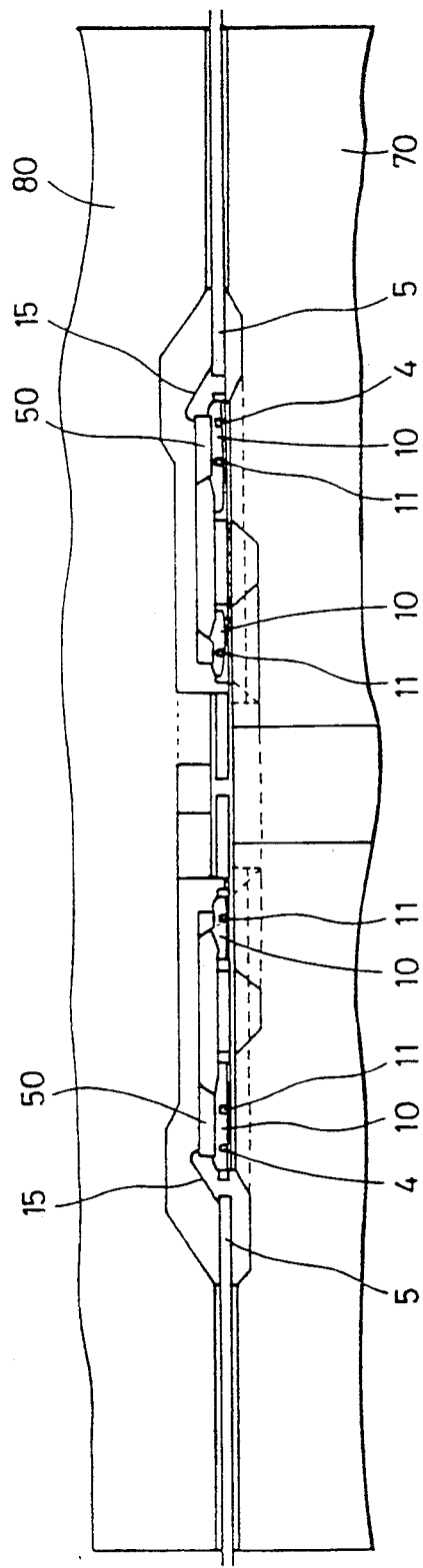
FIG. 7 is a sectional view of a structure of the semiconductor pressure sensor device of FIG. 6B used for measuring air pressure.

FIG. 7 is a sectional view of the semiconductor pressure sensor device of FIG. 6B used for measuring air pressure.

Referring to FIG. 7, a cavity which is the pressure measuring chamber is formed by base 70 and cap 80 in the case of an air measuring application. The measurement of pressure with such a structure is high in accuracy compared with conventional semiconductor pressure sensor devices because stress-resisting projection 4, supporting projection 11, and die-bond adhesive 10 are provided for stress relax in the semiconductor pressure sensor device of the present embodiment.

Figure 8:
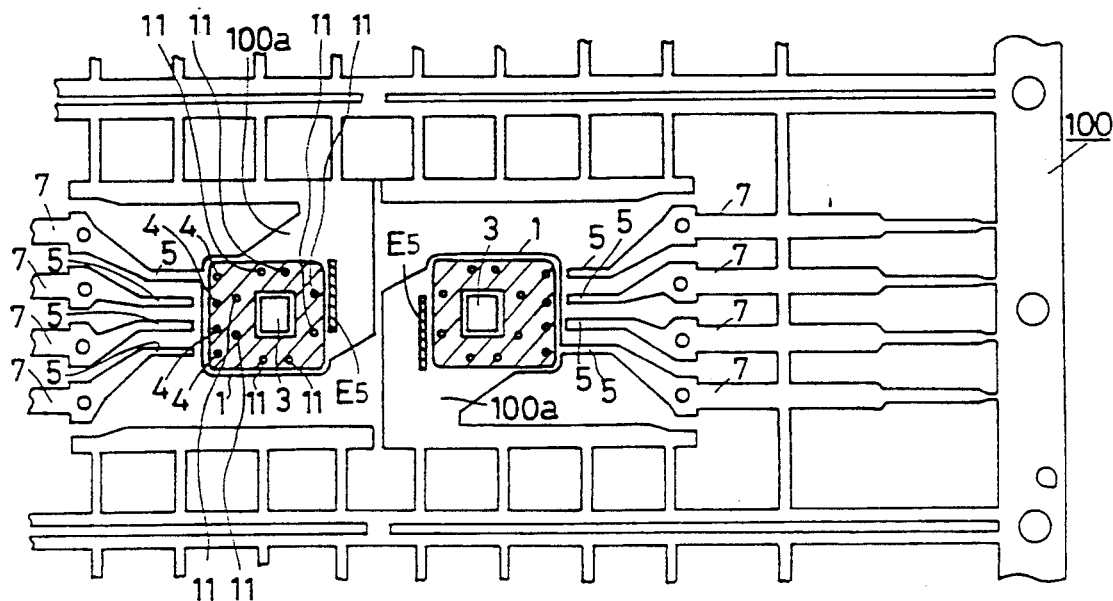
FIG. 8 is a plan view showing a lead frame of a second embodiment of the present invention.

FIG. 8 is a plan view of a lead frame of a second embodiment of the present invention. Referring to FIG. 8, an etching region $E_5$ is provided along the interface region of diepad 1 and suspension 100a of frame 100 supporting diepad 1. In implementing a semiconductor pressure sensor device having a pressure measuring chamber (cavity) of FIG. 7, such an etching region $E_5$ will uniform the thickness of the adhesive to improve the sealing performance. Furthermore, the adherence of the excessive adhesive resin to semiconductor pressure sensor chip 50 at the time of attaching base 70 and cap 80 can be prevented so that the sensor pressuring characteristic is not reduced.

Figure 9:
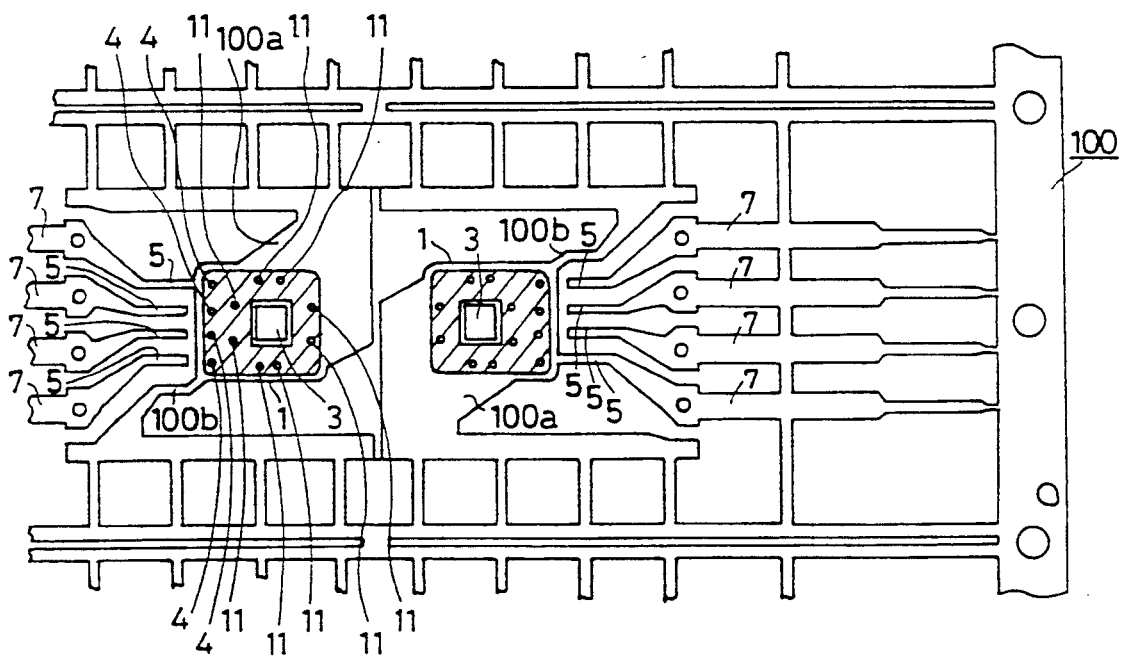
FIG. 9 is a plan view of a lead frame of a third embodiment of the present invention.

FIG. 9 is a plan view of a lead frame of a third embodiment of the present invention. Referring to FIG. 9, diepad 1 is supported by another suspension 100b in addition to a conventional suspension 100a. By supporting diepad 20 symmetrically in the above manner, the aforementioned problem of diepad 1 rising when fixed on base 70 due to the applied adhesive having high viscosity can be solved so that diepad 1 can be attached horizontally without a fixing jig.

Figure 10:
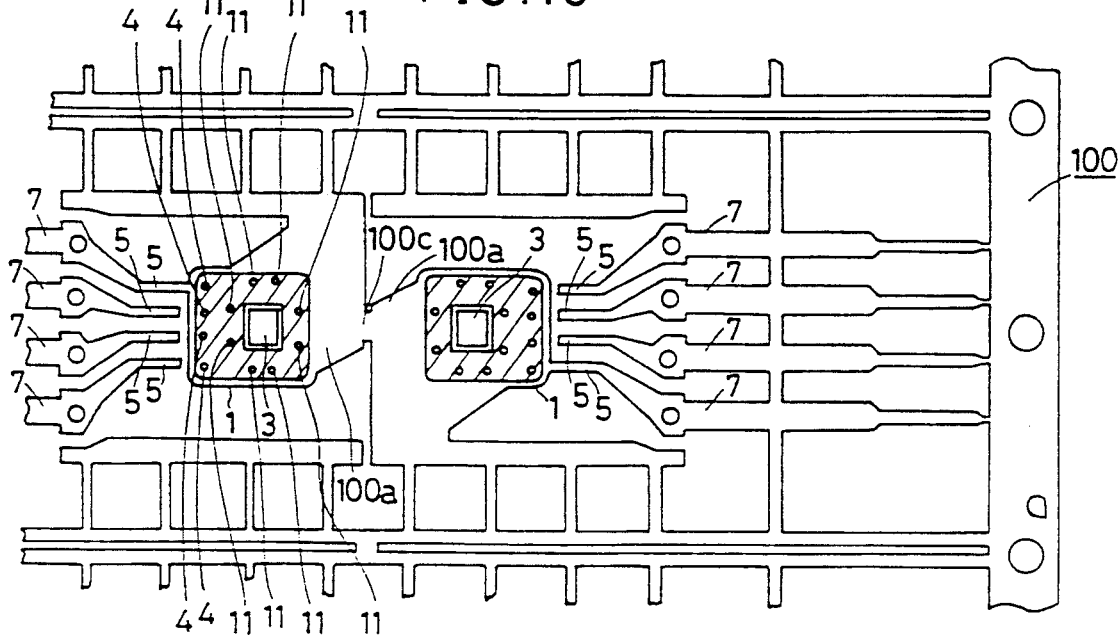
FIG. 10 is a plan view of a lead frame of a fourth embodiment of the present invention.

FIG. 10 is a plan view of a lead frame of a fourth embodiment of the present invention. Referring to FIG. 10, suspensions 100a for supporting the adjacent diepads 1 are connected by a center junction 100c at the center portion between diepads 1. This structure will solve the conventional problem seen in the semiconductor pressure sensor device of FIG. 7 that the sealing performance at the center portion between diepads 1 is decreased in attaching base 70 and cap 80. The present embodiment will also solve the problem that physical continuity in the deformation of the two chips is eliminated when external force is exerted on frame 100 in conventional devices where the center portion is divided. Consequently, the measuring accuracy of the semiconductor pressure sensor device is improved.

Figure 11:
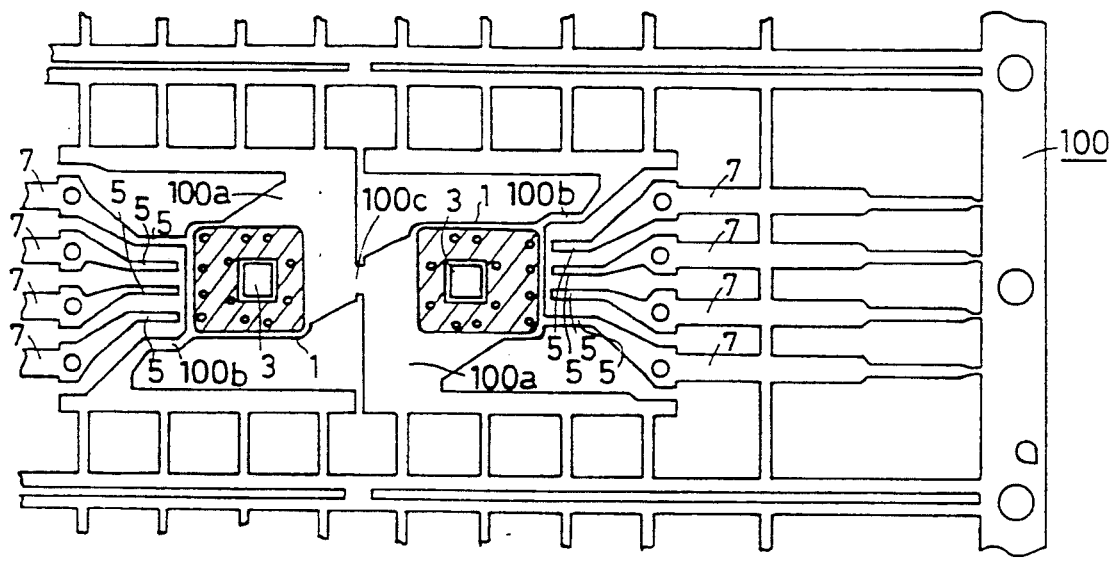
FIG. 11 is a plan view of a lead frame of a fifth embodiment of the present invention.
Figure 12:
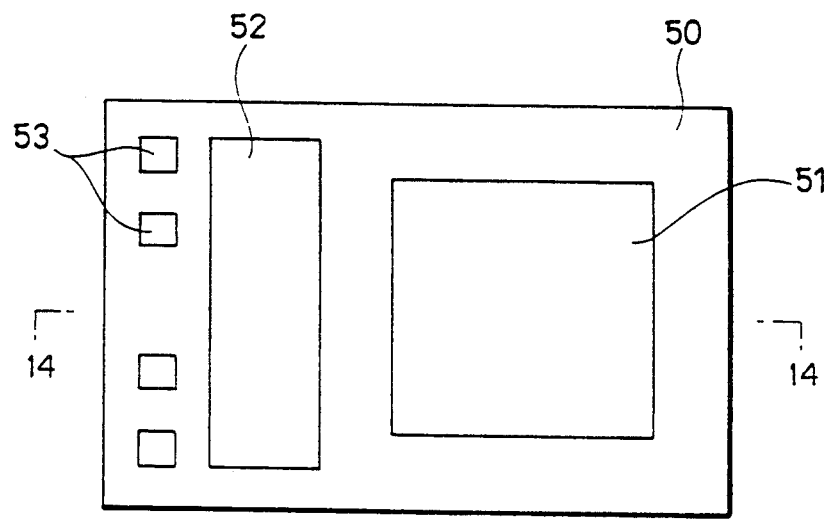
FIG. 12 is a plan view of a conventional semiconductor pressure sensor chip.
Figure 13:
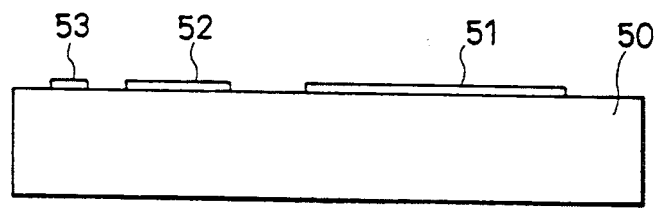
FIG. 13 is a side view of the semiconductor pressure sensor chip of FIG. 12.
Figure 14:
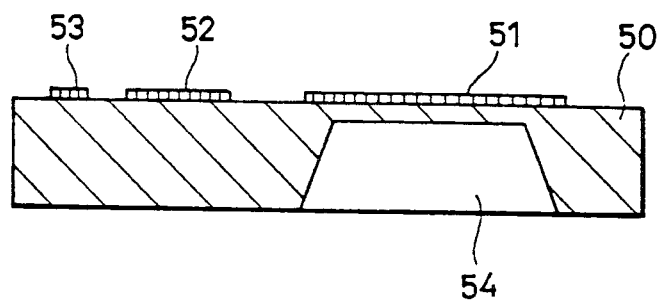
FIG. 14 is a sectional view of the semiconductor pressure sensor chip of FIG. 13.

FIG. 11 is a plan view of a lead frame of a fifth embodiment of the present invention. This embodiment is a combination of the third embodiment of FIG. 9 and the fourth embodiment of FIG. 10. Diepad 1 can be attached horizontally to base 70 (refer to FIG. 7) without using a fixing jig by providing suspension 100b in addition to suspension 100a to support diepad 1. Furthermore, by connecting the center portion between diepads 1 with center junction 100c, physical continuation is maintained regarding deformation by external force, as well as improving the sealing performance of the cavity. Although the embodiments of FIGS. 8–10 each show an example where a new structure is provided, the embodiments of FIGS. 8–10 may be implemented in combination if required.

In the semiconductor pressure sensor device having diepad 1 of FIG. 1, thermal stress generated at pressure sensor 51 of semiconductor pressure sensor chip 50 is decreasing to improve the measuring accuracy of the semiconductor pressure sensor device, by forming a die-bond adhesive 10 having an uniform thickness and stress decreasing ability between semiconductor pressure sensor chip 50 and diepad 1. Furthermore, by providing diepad 1 with a wire bond receiving projection 4 for receiving pressure application force from the bottom of semiconductor pressure sensor chip 50 at the time of wire bonding, and a supporting projection 11 for preventing distortion stress due to wire bond receiving projection 4 from being transmitted, stress acting on semiconductor pressure sensor chip 50 is relaxed to improve the measuring accuracy.

In the semiconductor pressure sensor device having a cavity implemented with lead frame 100 of FIG. 8, the formation of a groove-like etching region $E_5$ along the interface region of suspension 100a supporting diepad 1 and diepad 1 prevents excessive adhesive resin from flowing and adhering to semiconductor pressure sensor chip 50 side in attaching base 70 and cap 80 to lead frame 100, by running into etching region $E_5$. Furthermore, by suppressing the region for forming etching region $E_5$ to a minimum, the thickness of the adhesive layer is uniform in attaching base 70 and cap 80 to lead frame 100 to improve the sealing performance.

In the semiconductor pressure sensor device having the cavity applied with lead frame 100 of FIG. 9, diepad 1 is supported by suspension 100b, in addition to a conventional suspension 100a. Therefore diepad 1 does not rise when attaching lead frame 100 on base 70 even when the adhesive applied on the surface of base 70 has high viscosity. Diepad 1 of lead frame 100 can be attached horizontally to base 70 without using fixing jigs.

In the semiconductor pressure sensor device having the cavity where lead frame 100 of FIG. 10 is implemented, suspensions 100a for holding diepad 1 are connected by center junction 100c at the center position between adjacent diepads 1. The thickness of the adhesive at the center portion is also equal to that of other portions to improve the sealing performance of the cavity. In the case external force is exerted on lead frame 100, the connection at the center portion implements physical continuity of the deformation transmitted to diepads 1 where two semiconductor pressure sensor chips 50 are mounted.

In the method of manufacturing the semiconductor pressure sensor device of FIGS. 6A and 6B, the pressure application force received by semiconductor pressure sensor chip 50 is received by wire bond receiving projection 4 provided in concave 2 through the bottom of semiconductor pressure sensor chip 50 corresponding to electrodes 53 in connecting metal fine wire 15 to electrode 53 with pressure. The pressure application force is not absorbed by die-bond adhesive 10 at the time of pressure-attaching to properly connect electrode 53. Die-bond adhesive 10 having stress decreasing ability and uniform thickness between semiconductor pressure sensor chip 50 and diepad 1 can be implemented to relax thermal stress generated in pressure sensor 51 of semiconductor pressure sensor chip 50 to improve the measuring accuracy of the semiconductor pressure sensor device.

In accordance with a concept of the present invention, an intermediate fixing layer having a predetermined thickness is fixed at the mounting position of the semiconductor pressure sensor chip of the lead frame for fixing the semiconductor pressure sensor chip to the side of the lead frame. The semiconductor pressure sensor chip is fixed on the intermediate fixing layer. By implementing the intermediate fixing layer with a resilient material that can absorb the thermal distortion difference generated between the semiconductor pressure sensor chip and the lead frame, thermal stress acting between the lead frame and the semiconductor pressure sensor chip is relaxed to improve the measuring accuracy of the semiconductor pressure sensor device without providing a silicon base. By providing a stress-resisting projection at a position corresponding to the electrode of the semiconductor pressure sensor chip for receiving pressure application force from the bottom of the semiconductor pressure sensor chip, and also providing a supporting projection at a predetermined position so that distortion stress due to thermal distortion is not transmitted to the pressure sensor of the semiconductor pressure sensor chip, the pressure application force is not absorbed by the intermediate fixing layer at the time of pressure-attaching to properly connect the electrode and the metal fine wire with pressure. Because distortion stress arising from stress-resisting projection is not generated at the pressure sensor of the semiconductor pressure sensor chip, thermal stress acting between the lead frame and the semiconductor pressure sensor chip can be adjusted by the intermediate fixing layer, the stress-resisting projection, and the supporting projection, to improve the measuring accuracy of the semiconductor pressure sensor device.

In another concept of the present invention, the lead frame is provided with a diepad wherein the semiconductor pressure sensor chip is mounted, and an outer frame having a resin antiflowing groove in at least along one portion of the interface region with the diepad so that at least one portion thereof connects and supports the diepad. The adhesive resin flowing to the side of the semiconductor pressure sensor chip in attaching the cap and base above and beneath the lead frame runs into the resin antiflow groove. This will prevent the adhesive resin to adhere to the semiconductor pressure sensor chip in attaching the base and the cap to the lead frame where the semiconductor pressure sensor chip is mounted. Therefore the characteristic of pressure measuring is not decreased in the semiconductor pressure sensor device.

In a further concept of the present invention, the lead frame is provided with diepads where the semiconductor pressure sensor chip is mounted, and with an outer frame for connecting and supporting diepads diagonally at least at two locations. The diepads are supported symmetrically to prevent the diepads of the lead frame from being raised by the adhesive resin in being attached to the base, eliminating the need of a fixing jig. The diepad can be attached horizontally with ease without using a fixing jig.

In a still further concept of the present invention, the lead frame is provided with diepads where the semiconductor pressure sensor chip is mounted, and with an outer frame connected to each other at the center portion thereof between adjacent diepads so that at least one portion thereof connects and supports the diepads. The thickness of the adhesive is uniformed at the center portion in attaching the base and the cap to the lead frame with an adhesive. External force is transmitted to the two semiconductor pressure sensor chips physically in continuation. Therefore, the sealing performance of the cap and base attached over and beneath the lead frame is improved. Physical continuation with respect to deformation by external force is implemented with the two continued semiconductor pressure sensor chips.

In still another concept of the present invention, a lead frame having a stress-resisting projection formed at a position corresponding to the electrode of the semiconductor pressure sensor chip and a supporting projection at a predetermined position for maintaining the semiconductor pressure sensor chip horizontally, and a semiconductor pressure sensor chip are fixed together by an intermediate fixing layer having a predetermined thickness and stress decreasing ability. By pressure-attaching a metal fine wire to the electrode receiving the bottom of the electrode of the semiconductor pressure sensor chip by the stress-resisting projection, the electrode and the metal fine wire can be pressure-attached properly without the pressure application force being absorbed by the intermediate fixing layer. Thermal stress acting between the lead frame and the semiconductor pressure sensor chip can also be decreased.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor pressure sensor device comprising:

a semiconductor pressure sensor chip having a semiconductor substrate, a pressure sensor for sensing pressure, an amplifying circuit for amplifying the signal from said pressure sensor, and electrodes formed on said semiconductor substrate, a lead frame for mounting said semiconductor pressure sensor chip, an intermediate fixing layer formed of a resilient material having a predetermined thickness to absorb and relax thermal distortion difference generated between said semiconductor pressure member chip and said lead frame for fixing said semiconductor pressure sensor chip to said lead frame, a stress-resisting projection provided at a position of said lead frame corresponding to an electrode of said semiconductor pressure sensor chip for relieving pressure applied from the bottom of said semiconductor pressure sensor chip in pressure-attaching said electrode and a metal fine wire, and a supporting projection provided at a predetermined location of said lead frame for preventing distortion stress on said stress-resisting projection from being transmitted to said pressure sensor of said semiconductor pressure sensor chip.

2. The semiconductor pressure sensor device according to claim 1, wherein said lead frame comprises
a diepad for attaching said semiconductor pressure sensor chip with said intermediate fixing layer therebetween, an outer frame provided so that at least one portion thereof connects and supports said diepad, and having at least one first concave region of the connecting portion, and a lead connected electrically with the electrode of said semiconductor pressure sensor chip, provided so that at least one portion connects and supports said diepad, and having a second concave region connecting with said diepad.

3. The semiconductor pressure sensor device according to claim 2, wherein said diepad comprises a a third concave region where said intermediate fixing layer is formed, and provided with a stress-resisting projection and a supporting projection at predetermined positions for stress relief.

4. The semiconductor pressure sensor device according to claim 2, wherein said outer frame comprises a resin antiflowing groove formed in a fourth concave region.

5. A semiconductor pressure sensor device comprising:
a semiconductor pressure sensor chip having a semiconductor substrate, a pressure sensor for sensing pressure, an amplifying circuit for amplifying the signal from said pressure sensor, and electrodes formed on said semiconductor substrate, a lead frame for mounting said semiconductor pressure sensor chip, a diepad provided in said lead frame for attaching said semiconductor pressure sensor chip, and an outer frame provided in said lead frame so that at least one part connects and supports said diepad, and having a resin antiflow groove formed along at least one portion of an interface region with said diepad.

6. The semiconductor pressure sensor device according to claim 5, wherein said diepad comprises a region formed in a concave manner where said semiconductor pressure sensor chip is attached, and provided with a stress-resisting projection and a supporting projection as predetermined positions for stress relief.

7. A semiconductor pressure sensor device comprising:
a semiconductor pressure sensor chip having a semiconductor substrate, a pressure sensor for sensing pressure, an amplifying circuit for amplifying the signal from said pressure sensor, and electrodes formed on said semiconductor substrate, a lead frame for mounting said semiconductor pressure sensor chip, said lead frame including a diepad for attaching said semiconductor pressure sensor chip, and an outer frame provided in said lead frame for connecting and supporting said diepad diagonally at least at two locations.

8. The semiconductor pressure sensor device according to claim 7, wherein said diepad comprises a concave region where said semiconductor pressure sensor chip is attached, and provided with a stress-resisting projection and a supporting projection at predetermined positions for stress relief.

9. A semiconductor pressure sensor device comprising:
a semiconductor pressure sensor chip having a semiconductor substrate, a pressure sensor for sensing pressure, an amplifying circuit for amplifying the signal from said pressure sensor, and electrodes formed on said semiconductor substrate, a lead frame for mounting said semiconductor pressure sensor chip, a diepad provided in said lead frame for attaching said semiconductor pressure sensor chip, and an outer frame provided in said lead frame so that at least a first portion thereof connects and supports said diepad, and a second portion of said outer frame is connected to a second outer frame of a second identical semiconductor pressure sensor device at a center portion between adjacent diepads of said first and second semiconductor pressure sensor devices.

10. The semiconductor pressure sensor device according to claim 9, wherein said diepad comprises a diepad having a concave region where said semiconductor pressure sensor chip is attached, and provided with a stress-resisting projection and a supporting projection at predetermined positions for stress relief.

* * * * *